United States Patent
Hardikar et al.

(10) Patent No.: US 9,227,347 B2
(45) Date of Patent: Jan. 5, 2016

(54) METHOD OF MAKING A HEAT SINK ASSEMBLY, HEAT SINK ASSEMBLIES MADE THEREFROM, AND ILLUMANTS USING THE HEAT SINK ASSEMBLY

(71) Applicant: SABIC Innovative Plastics IP B.V., Bergen op Zoom (NL)

(72) Inventors: Narendra Anand Hardikar, Bangalore (IN); Harindranath K. Sharma, Bangalore (IN)

(73) Assignee: SABIC GLOBAL TECHNOLOGIES B.V. (NL)

( * ) Notice: Subject to any disclaimer, the term of this patent is extended or adjusted under 35 U.S.C. 154(b) by 90 days.

(21) Appl. No.: 13/775,442

(22) Filed: Feb. 25, 2013

(65) Prior Publication Data
US 2014/0240989 A1 Aug. 28, 2014

(51) Int. Cl.
| | |
|---|---|
| *F21V 29/00* | (2006.01) |
| *H01J 1/62* | (2006.01) |
| *B29C 45/14* | (2006.01) |
| *F21V 29/89* | (2015.01) |
| *H01L 23/373* | (2006.01) |
| *H01L 33/64* | (2010.01) |
| *F21Y 101/02* | (2006.01) |

(52) U.S. Cl.
CPC .............. *B29C 45/14* (2013.01); *F21V 29/89* (2013.01); *F21Y 2101/02* (2013.01); *H01L 23/3733* (2013.01); *H01L 23/3737* (2013.01); *H01L 33/642* (2013.01); *H01L 2924/0002* (2013.01)

(58) Field of Classification Search
CPC ................................ F21V 29/89; B29C 45/14

USPC ............................ 362/294, 235, 231; 445/23
See application file for complete search history.

(56) References Cited

U.S. PATENT DOCUMENTS

| | | | |
|---|---|---|---|
| 5,232,970 A | 8/1993 | Solc et al. | |
| 6,048,919 A | 4/2000 | McCullough | |

(Continued)

FOREIGN PATENT DOCUMENTS

| | | |
|---|---|---|
| EP | 1260619 A1 | 11/2002 |
| EP | 1302443 A2 | 4/2003 |

(Continued)

OTHER PUBLICATIONS

Grujicic et al.; "The Effect of Thermal Contact Resistance on Heat Management in the Electronic Packaging"; Applied Surface Science; 246; pp. 290-302; (2005).

(Continued)

*Primary Examiner* — Joseph L Williams
(74) *Attorney, Agent, or Firm* — Cantor Colburn LLP

(57) ABSTRACT

In an embodiment, a method of making a heat sink assembly can include: forming a heat sink assembly comprising a polymer heat sink around a metal insert, the polymer heat sink comprising a thermally conductive polymer material, wherein the heat sink assembly has a contact pressure between the polymer heat sink and the metal insert; and increasing the contact pressure. In an embodiment, a method of making a heat sink assembly includes: heating a mold and subsequently introducing a metal insert to the mold, wherein the metal insert has an insert temperature of 30° C. to 70° C. when it is inserted into the mold; closing the mold; and in less than or equal to 10 seconds of closing the mold, over-molding the metal insert with a thermally conductive polymer material to form a heat sink assembly.

21 Claims, 3 Drawing Sheets

(56) References Cited

U.S. PATENT DOCUMENTS

| | | | |
|---|---|---|---|
| 6,162,849 A | 12/2000 | Zhuo et al. |
| 6,165,612 A | 12/2000 | Misra |
| 6,251,978 B1 | 6/2001 | McCullough |
| 6,500,891 B1 | 12/2002 | Kropp et al. |
| 6,600,633 B2 | 7/2003 | Macpherson et al. |
| 6,620,497 B2 | 9/2003 | Smith et al. |
| 6,710,109 B2 | 3/2004 | McCullough et al. |
| 6,730,731 B2 | 5/2004 | Tobita et al. |
| 6,756,005 B2 | 6/2004 | Panek et al. |
| 6,835,347 B2 | 12/2004 | McCullough et al. |
| 6,899,160 B2 | 5/2005 | McCullough |
| 6,926,955 B2 | 8/2005 | Jayaraman et al. |
| 6,976,769 B2 | 12/2005 | McCullough et al. |
| 6,981,805 B2 | 1/2006 | Miller et al. |
| 7,077,990 B2 | 7/2006 | Miller |
| 7,189,778 B2 | 3/2007 | Tobita et al. |
| 7,462,309 B2 | 12/2008 | Miller et al. |
| 7,476,702 B2 | 1/2009 | Sagal et al. |
| 8,003,016 B2 | 8/2011 | Mercx et al. |
| 8,029,694 B2 | 10/2011 | Saga |
| 8,198,347 B2 | 6/2012 | Fung et al. |
| 2006/0099338 A1 | 5/2006 | Boelz et al. |
| 2008/0012036 A1 | 1/2008 | Loh et al. |
| 2008/0143959 A1 | 6/2008 | Bourdoncle et al. |
| 2008/0153959 A1 | 6/2008 | Charati et al. |
| 2008/0251769 A1 | 10/2008 | Li et al. |
| 2008/0277619 A1 | 11/2008 | Matsumoto et al. |
| 2009/0130471 A1 | 5/2009 | Saga et al. |
| 2009/0152491 A1 | 6/2009 | Saga et al. |
| 2009/0221734 A1 | 9/2009 | Kuwahara et al. |
| 2009/0253847 A1 | 10/2009 | Komatsu et al. |
| 2010/0012884 A1 | 1/2010 | Nakamichi et al. |
| 2010/0072416 A1 | 3/2010 | Fujioka et al. |
| 2010/0113668 A1 | 5/2010 | Saga et al. |
| 2010/0208429 A1 | 8/2010 | Zhang et al. |
| 2010/0219381 A1 | 9/2010 | Jeschke et al. |
| 2011/0027565 A1 | 2/2011 | Matsumoto et al. |
| 2011/0030920 A1 | 2/2011 | Qin et al. |
| 2012/0080640 A1 | 4/2012 | Saga |
| 2013/0003416 A1 | 1/2013 | Saga et al. |
| 2013/0068419 A1 | 3/2013 | Mase et al. |

FOREIGN PATENT DOCUMENTS

| | | |
|---|---|---|
| JP | 2005298552 | 10/2007 |
| WO | 9502504 A1 | 1/1995 |
| WO | 2005024942 A1 | 3/2005 |
| WO | 2005071001 A1 | 8/2005 |
| WO | 2005123867 A2 | 12/2005 |
| WO | 2006007385 A1 | 1/2006 |
| WO | 2006039291 | 4/2006 |
| WO | 2006064032 A1 | 6/2006 |
| WO | 2006135840 A1 | 12/2006 |
| WO | 2008006443 A1 | 1/2008 |
| WO | 2008134031 A2 | 11/2008 |
| WO | 2009012933 A1 | 1/2009 |
| WO | 2010053225 A1 | 5/2010 |
| WO | 2010097466 A1 | 9/2010 |
| WO | 2012114309 A1 | 8/2012 |
| WO | 2012120185 A2 | 9/2012 |
| WO | 2012164506 A1 | 12/2012 |

OTHER PUBLICATIONS

International Search Report and Written Opinion; International Application No. PCT/IB2014/058822; International Filing Date Feb. 5, 2014; Date of Mailing May 28, 2014; 12 pages.

Second Written Opinion; International Application No. PCT/IB2014/058822; International Filing Date Feb. 5, 2014; Date of Mailing Feb. 13, 2015; 7 pages.

International Preliminary Report on Patentability: International Application PCT/IB2014/058822; International Filing Date Feb. 5, 2014; Date of Mailing Jun. 3, 2015; 16 pages; Applicant's File Reference P080084PCT.

US 9,227,347 B2

METHOD OF MAKING A HEAT SINK ASSEMBLY, HEAT SINK ASSEMBLIES MADE THEREFROM, AND ILLUMANTS USING THE HEAT SINK ASSEMBLY

BACKGROUND

Disclosed herein are methods of making a heat sink assembly and articles made therefrom.

Light emitting diodes (LEDs) are currently used as replacements for incandescent light bulbs and fluorescent lamps. LEDs are semiconductor devices that emit incoherent narrow-spectrum light when electrically biased in the forward direction of their PN junctions, and are thus referred to as solid-state lighting devices. In an LED light device, the core is a LED chip mounted on a substrate. A transparent top covering the LED chip serves as a lens for modifying the direction of the emitted light.

The high power LED light devices produce considerable amount of heat, which may cause performance degradation or even damage if the heat is not efficiently removed from the LED chips. Thus, in such LED light devices, thermal management is of great importance as a high temperature of the LED can adversely impact the efficiency, as well as the longevity of the device, if sufficient heat is not dissipated away from the chip.

Metals have traditionally been used for heat sink applications in LED housings, due to their effective thermal conductivity and thus ability to dissipate heat away from the LED chip. However, given the need for electrical isolation, design flexibility, part integration, and lighter weight devices, alternatives to metals are continually being sought.

SUMMARY

Disclosed herein are methods for making heat sink assemblies, heat sink assemblies made therefrom, and illuminants comprising the heat sink assemblies.

In an embodiment, a method of making a heat sink assembly (10), comprising: forming a heat sink assembly (10) comprising a polymer heat sink (14) around a metal insert (12), the polymer heat sink (14) comprising a thermally conductive polymer material, wherein the heat sink assembly (10) has a contact pressure between the polymer heat sink (14) and the metal insert (12); and increasing the contact pressure.

In another embodiment, a method of making a heat sink assembly (10), comprises: reducing a surface roughness of a metal insert (12); and subsequent to reducing the surface roughness, forming a heat sink assembly (10) comprising a polymer heat sink (14) around the metal insert (12), the polymer heat sink (14) comprising a thermally conductive polymer material, wherein the metal insert (12) has an exposed inner surface (16) and has an outer surface (18) in contact with the polymer heat sink (14).

In yet another embodiment, a method of making a heat sink assembly (10), comprising: heating a mold to a mold temperature; subsequent to the mold attaining the mold temperature, introducing a metal insert to the mold, wherein the metal insert has an insert temperature of 30° C. to 70° C. when it is inserted into the mold; closing the mold; and in less than or equal to 10 seconds of closing the mold, over-molding the metal insert with a thermally conductive polymer material to form a heat sink assembly (10).

These and other features will be described in further detail below with reference to the figures and detailed description.

BRIEF DESCRIPTION OF THE DRAWINGS

Refer now to the figures, which are exemplary embodiments, and wherein the like elements are numbered alike.

DETAILED DESCRIPTION

Polymer materials, such as thermoplastics, can potentially offer an attractive alternative to metals in LED device applications. However, the traditionally low thermal conductivity of polymers presents a challenge in employing them as a material for the (e.g., LED) heat sink assembly. In an attempt to address this challenge, thermally conductive polymers (e.g., thermoplastics) having a higher conductivity than conventional thermoplastics can be employed. However, it has been determined that the conductivity of such polymers while being higher than conventional, non-conductive polymers, is still lower than metals, such as aluminum and copper. Thus, to address this issue and enhance design variables, such as part integration, design flexibility, and a light weight design, hybrid LED heat sink assembly can be employed. These hybrid LED heat sink assemblies employ a metal insert overmolded by a conductive polymer. However, the thermal performance of even these bi-material hybrids design is not equal to that of all metal design due to the lower thermal conductivity of the thermoplastic.

It has been determined how to increase the conductivity of a hybrid LED heat sink assembly such that heat can be effectively dissipated away from the LED chip. Specifically, it has herein been determined that reducing the thermal contact resistance at the bi-material (metal insert-plastic heat sink) interface will effectively enhance heat transfer. The thermal contact resistance can be reduced by enhancing the contact pressure at the interface (e.g., as compared to a heat sink having the same insert and polymer, without the secondary operations or without the temperature process), for example, through the use of secondary operations after molding of the hybrid LED heat sink assembly and/or via the temperature of the metal insert used in the molding process, as explained in further detail below.

Figure 1:
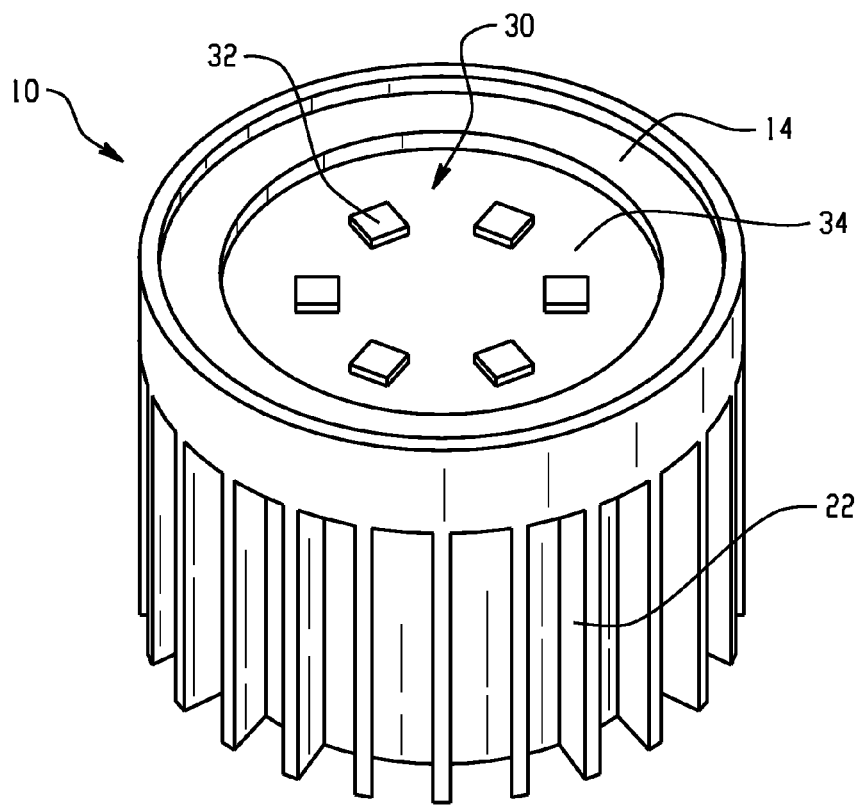
FIG. 1 is a perspective view of an example of metal-plastic hybrid heat sink assembly.
Figure 2:
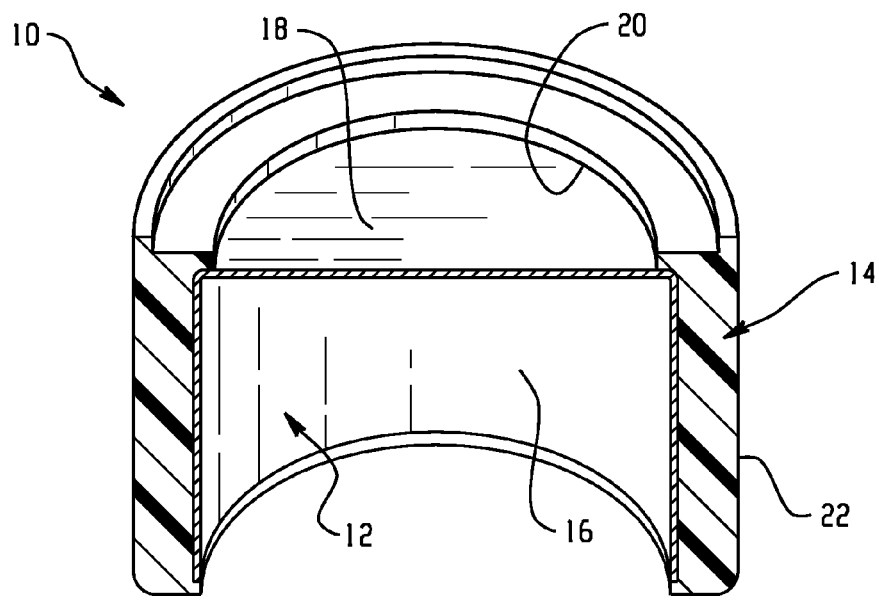
FIG. 2 is a cross-sectional view of the metal-plastic hybrid heat sink assembly of FIG. 1.

FIG. 1 is a perspective view of an embodiment of a metal-plastic hybrid LED heat sink assembly 10. The LED heat sink assembly 10 can comprise a metal insert 12, as shown best in FIG. 2, over-molded with a polymer heat sink 14 to form an integrated hybrid LED heat sink assembly 10. FIG. 2 shows a cross-sectional view of an exemplary metal-hybrid LED heat sink assembly 10 illustrating metal insert 12. As shown in FIG. 2, metal insert 12 can have an exposed inner surface 16 (e.g., exposed to the air/atmosphere) which forms an inner portion of the metal-hybrid LED heat sink assembly 10. The metal insert 12 also comprises an outer surface 18 in contact with the polymer heat sink 14, as shown for example, in FIG. 2, forming an interface 20.

The metal insert 12 can be made of, e.g., aluminum, copper, or other metal, as well as combinations comprising at least one of the foregoing. The shape of the metal insert is dependent upon the specific design of the LED housing and the desired heat sink assembly. Any desirable shape is possible.

The polymer heat sink 14 is disposed around the outer surface 18 of the metal insert. The polymer heat sink 14 can comprise a thermally conductive polymer. The thermally conductive polymers can optionally also be electrically insulating, e.g., having an electrical resistivity greater than or equal to $10^{13}$ Ohms per square centimeter (Ohm/cm$^2$). The thermally conductive polymer can comprise an organic polymer and a filler composition comprising graphite and boron nitride. For example, the thermally conductive polymer can have a bulk surface resistivity greater than or equal to $10^{13}$ Ohm/cm$^2$, while displaying a thermal conductivity greater than or equal to 2 W/m-K. The melt flow index can be 1 to 30 grams per 10 minutes at a temperature of 280° C. and a load of 16 kilograms force per square centimeter (kg-f/cm$^2$). Examples of thermally conductive polymers are disclosed in commonly assigned U.S. Patent Ser. Nos. 61/446,665, 61/446,666, and Ser. No. 11/689,228.

The polymer used in the thermally conductive polymer can be selected from a wide variety of thermoplastic resins, blend of thermoplastic resins, thermosetting resins, or blends of thermoplastic resins with thermosetting resins, as well as combinations comprising at least one of the foregoing. The polymer may also be a blend of polymers, copolymers, terpolymers, or combinations comprising at least one of the foregoing. The organic polymer can also be an oligomer, a homopolymer, a copolymer, a block copolymer, an alternating block copolymer, a random polymer, a random copolymer, a random block copolymer, a graft copolymer, a star block copolymer, a dendrimer, or the like, or a combination comprising at least one of the foregoing. Examples of the organic polymer include polyacetals, polyolefins, polyacrylics, poly(arylene ether)polycarbonates, polystyrenes, polyesters (e.g., cycloaliphatic polyester, high molecular weight polymeric glycol terephthalates or isophthalates, and so forth), polyamides (e.g., semi-aromatic polyamid such as PA4.T, PA6.T, PA9.T, and so forth), polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, styrene acrylonitrile, acrylonitrile-butadiene-styrene (ABS), polyethylene terephthalate, polybutylene terephthalate, polyurethane, ethylene propylene diene rubber (EPR), polytetrafluoroethylene, fluorinated ethylene propylene, perfluoroalkoxyethylene, polychlorotrifluoroethylene, polyvinylidene fluoride, or the like, or a combination comprising at least one of the foregoing organic polymers. Examples of polyolefins include polyethylene (PE), including high-density polyethylene (HDPE), linear low-density polyethylene (LLDPE), low-density polyethylene (LDPE), mid-density polyethylene (MDPE), glycidyl methacrylate modified polyethylene, maleic anhydride functionalized polyethylene, maleic anhydride functionalized elastomeric ethylene copolymers (like EXXELOR VA1801 and VA1803 from ExxonMobil), ethylene-butene copolymers, ethylene-octene copolymers, ethylene-acrylate copolymers, such as ethylene-methyl acrylate, ethylene-ethyl acrylate, and ethylene butyl acrylate copolymers, glycidyl methacrylate functionalized ethylene-acrylate terpolymers, anhydride functionalized ethylene-acrylate polymers, anhydride functionalized ethylene-octene and anhydride functionalized ethylene-butene copolymers, polypropylene (PP), maleic anhydride functionalized polypropylene, glycidyl methacrylate modified polypropylene, and a combination comprising at least one of the foregoing polymers.

In the context of this application a 'semi-aromatic polyamide' is understood to be a polyamide homo- or copolymer that contains aromatic or semi-aromatic units derived from an aromatic dicarboxylic acid, an aromatic diamine or an aromatic aminocarboxylic acid, the content of said units being at least 50 mol %. In some cases these semi-aromatic polyamides are blended with small amounts of aliphatic polyamides for better processability. They are available commercially, e.g. DuPont, Wilmington, Del., USA under the Tradename Zytel HTN, Solvay Advanced Polymers under the Tradename Amodel or from DSM, Sittard, The Netherlands under the Tradename Stanyl For Tii.

Examples of blends of thermoplastic resins include acrylonitrile-butadiene-styrene/nylon, polycarbonate/acrylonitrile-butadiene-styrene, acrylonitrile butadiene styrene/polyvinyl chloride, polyphenylene ether/polystyrene, polyphenylene ether/nylon, polysulfone/acrylonitrile-butadiene-styrene, polycarbonate/thermoplastic urethane, polycarbonate/polyethylene terephthalate, polycarbonate/polybutylene terephthalate, thermoplastic elastomer alloys, nylon/elastomers, polyester/elastomers, polyethylene terephthalate/polybutylene terephthalate, acetal/elastomer, styrene-maleicanhydride/acrylonitrile-butadiene-styrene, polyether etherketone/polyethersulfone, polyether etherketone/polyetherimide polyethylene/nylon, polyethylene/polyacetal, or the like.

Examples of thermosetting resins include polyurethane, natural rubber, synthetic rubber, epoxy, phenolic, polyesters, polyamides, silicones, or the like, or a combination comprising at least one of the foregoing thermosetting resins. Blends of thermoset resins as well as blends of thermoplastic resins with thermosets can be utilized.

For example, the polymer that can be used in the conductive composition is a polyarylene ether. The term poly(arylene ether) polymer includes polyphenylene ether (PPE) and poly(arylene ether) copolymers; graft copolymers; poly(arylene ether) ionomers; and block copolymers of alkenyl aromatic compounds with poly(arylene ether)s, vinyl aromatic compounds, and poly(arylene ether), and the like; and combinations including at least one of the foregoing.

The polymer can be used in amounts of 10 to 85 weight percent (wt %), specifically, 33 to 80 wt %, more specifically 35 wt % to 75 wt %, and yet more specifically 40 wt % to 70 wt %, of the total weight of the polymer heat sink.

The filler composition used in the polymer heat sink comprises a thermally conductive material. As used herein, a thermally conductive material has a thermal conductivity of greater than or equal to 50 watts per meter kelvin (W/mK). Desirably, the thermally conductive material has a thermal conductivity of greater than or equal to 80 W/mK, specifically, greater than or equal to 100 W/mK, more specifically, greater than or equal to 150 W/mK. Examples of the thermally conductive materials include, but are not limited to, AlN (aluminum nitride), BN (boron nitride), MgSiN$_2$ (magnesium silicon nitride), SiC (silicon carbide), graphite, or a combination comprising at least one of the foregoing. For example, ceramic-coated graphite, expanded graphite, graphene, carbon fiber, carbon nanotubes (CNT), graphitized carbon black, or a combination comprising at least one of the foregoing. The thermally conductive material can be used in amounts of greater than or equal to 5 wt %, specifically, 5 wt % to 60 wt %, more specifically, 10 wt % to 55 wt %, yet more specifically, 13 wt % to 45 wt %, and still more specifically 15 wt % to 35 wt %, based upon a total weight of the polymer heat sink.

If graphite is employed, it is desirable to use graphite having average particle sizes of 1 to 5,000 micrometers. Within this range graphite particles having sizes of greater than or equal to 3, specifically greater than or equal to 5 micrometers may be advantageously used. Also desirable are graphite particles having sizes of less than or equal to 4,000, specifically less than or equal to 3,000, and more specifically less than or equal to 2,000 micrometers. Graphite is generally flake like with an aspect ratio greater than or equal to 2, specifically greater than or equal to 5, more specifically greater than or equal to 10, and even more specifically greater than or equal to 50. In one aspect, the graphite is flake graphite, wherein the flake graphite is typically found as discrete flakes having a size of 10 micrometers to 800 micrometers in diameter (as measured along a major axis) and 1 micrometers to 150 micrometers thick, e.g., with purities ranging from 80-99.9% carbon. In another aspect the graphite is spherical.

Graphite is generally used in amounts of greater than or equal to 10 wt % to 30 wt %, specifically, 13 wt % to 28 wt %, more specifically 14 wt % to 26 wt %, and yet more specifically 15 wt % to 25 wt %, of the total weight of the polymer heat sink.

Possible boron nitrides include cubic boron nitride, hexagonal boron nitride, amorphous boron nitride, rhombohedral boron nitride, or another allotrope, as well as combinations comprising at least one of the foregoing. It may be used as powder, agglomerates, fibers, or the like, or a combination comprising at least one of the foregoing.

Boron nitride has an average particle size of 1 to 5,000 micrometers. Within this range boron nitride particles having sizes of greater than or equal to 3, specifically greater than or equal to 5 micrometers may be advantageously used. Also desirable are boron nitride particles having sizes of less than or equal to 4,000, specifically less than or equal to 3,000, and more specifically less than or equal to 2,000 micrometers. Boron nitride is generally flake like with an aspect ratio greater than or equal to 2, specifically greater than or equal to 5, more specifically greater than or equal to 10, and even more specifically greater than or equal to 50. An exemplary particle size is 125 to 300 micrometers with a crystal size of 10 to 15 micrometers. The boron nitride particles can exist in the form of agglomerates or as individual particles or as combinations of individual particles and agglomerates.

Boron nitride (BN) is generally used in amounts of 5 wt % to 60 wt %, specifically, 8 wt % to 55 wt %, more specifically 10 wt % to 50 wt %, and yet more specifically 12 wt % to 45 wt %, of the total weight of the polymer heat sink. An exemplary amount of boron nitride is 15 to 40 wt % of the total weight of the thermally conductive polymer. In one aspect, the BN has a BN purity of greater than or equal to 95 wt %, specifically, greater than or equal to 99.8 wt %. For example, large single crystal sized flake BN with an average size of 3 to 50 micrometer and a BN purity of greater than or equal to 98 wt % can be used. The particle size indicated here means the single BN particle or its agglomerate at any of their dimensions.

Additionally, the thermally conductive polymer can optionally also contain additives such as antioxidants, such as, for example, organophosphites, for example, tris(nonylphenyl)phosphite, tris(2,4-di-t-butylphenyl)phosphite, bis(2,4-di-t-butylphenyl)pentaerythritol diphosphite or distearyl pentaerythritol diphosphite, alkylated monophenols, polyphenols and alkylated reaction products of polyphenols with dienes, such as, for example, tetrakis[methylene(3,5-di-tert-butyl-4-hydroxyhydrocinnamate)]methane, 3,5-di-tert-butyl-4-hydroxyhydrocinnamate, octadecyl 2,4-di-tert-butylphenyl phosphite, butylated reaction products of para-cresol and dicyclopentadiene, alkylated hydroquinones, hydroxylated thiodiphenyl ethers, alkylidene-bisphenols, benzyl compounds, esters of beta-(3,5-di-tert-butyl-4-hydroxyphenyl)-propionic acid with monohydric or polyhydric alcohols, esters of beta-(5-tert-butyl-4-hydroxy-3-methylphenyl)-propionic acid with monohydric or polyhydric alcohols; esters of thioalkyl or thioaryl compounds, such as, for example, distearylthiopropionate, dilaurylthiopropionate, ditridecylthiodipropionate, amides of beta-(3,5-di-tert-butyl-4-hydroxyphenyl)-propionic acid; fillers and reinforcing agents, such as, for example, silicates, titanium dioxide ($TiO_2$), calcium carbonate, talc, mica and other additives such as, for example, mold release agents, ultraviolet absorbers, stabilizers such as light stabilizers and others, lubricants, plasticizers, pigments, dyes, colorants, anti-static agents, blowing agents, flame retardants, impact modifiers, among others, as well as combinations comprising at least one of the foregoing additives.

For example, the polymer heat sink can comprise a random distribution of graphite and boron nitride and have a thermal conductivity of greater than 1 Watt per meter-Kelvin (W/mK), specifically, greater than or equal to 2 W/mK, more specifically, greater than or equal to 5 W/mK, still more specifically, greater than or equal to 10 W/mK, and even greater than or equal to 15 W/mK. An example of a thermally conductive polymer is Konduit™ thermally conductive polymer commercially available from SABIC's Innovative Plastics business, including, but not limited to, grades PX08321, PX08322, PX09322, PX10321, PX10322, PX10323, and PX10324.

The design and shape of the LED heat sink assembly 10, and particularly the design and shape of the polymer heat sink 14, is dependent upon the specific application, input heat wattage, and heat transfer needed. The shape of the heat sink 14 is complementary to, e.g., a LED package comprising a LED chip that can be formed with the heat sink 14. The heat sink 14 can have a round or polygonal cross-sectional geometry. FIG. 1 illustrates a cylindrical heat sink 14.

The printed circuit board (PCB) package 30 can comprise a substrate 34 with light emitting diode(s) (LEDs) 32 mounted thereon to form the package. The LEDs 32 can be mounted on the substrate 34 using various techniques, such as soldering. The substrate 34 has a wiring for supplying a drive current to the LEDs 32. Further, the LED substrate 34 can include a terminal for supplying the drive current to the light-emitting diodes (LEDs) 32. The wiring can be made of, for example, copper or a copper-base metal material, and the light-emitting diodes (LEDs) 32 mounted on the substrate 34 are electrically connected to the wiring.

Optionally, the PCB package (which includes LED(s)) can comprise a substrate (without a circuit) supporting a LED and printed circuit. The PCB package can comprise a COB (chip on board) and/or COHC (chip on heat sink). Hence, in the various embodiments disclosed herein, COBs and/or COHCs can be used in addition or alternative to the LED.

The LEDs can be formed, for example, out of red LEDs emitting red light, green LEDs emitting green light, blue LEDs emitting blue light, or a combination comprising at least one of the foregoing by mixing light beams from the red, green, and blue LEDs, a light source having a wide range of color reproducibility can be achieved.

The polymer heat sink 14 also can comprise heat dissipation elements. These elements can extend from the wall(s)

and/or the side of the heat sink 14. Referring to FIG. 1, heat dissipation elements (e.g., fins) 22 are illustrated. The fins 22 are disposed radially around the heat sink, extending outward from the body of the heat sink 14 and increasing the surface area of the polymer heat sink 14. Any design and suitable spacing of the heat dissipation elements 22 are possible. The heat dissipation elements increase the surface area of the heat sink 14 to enhance heat dissipation away from the LED chip.

Insert molding can be used to over-mold the polymer heat sink 14 around the metal insert 12 to form the hybrid LED heat sink assembly 10. During insert molding, the metal insert 12 can be placed into a mold to form the polymer heat sink 14 around the metal insert 12. Specifically, the thermally conductive polymer can be heated to a molten state and introduced into the mold. The temperature employed is based upon, e.g., the particular materials, integrity of the metal insert 12, and the temperature needed to melt the thermally conductive polymer. In some embodiments, the polymer is melted, e.g., at a temperature of 150° C. to 300° C. (depending upon the melt temperature of the material). After the thermally conductive polymer has been introduced into the mold, the mold can be cooled (actively or passively) to produce an over-molded part, such as an integrally molded LED heat sink assembly 10 having an interface 20 between the polymer heat sink 14 and the metal insert 12, as shown in FIG. 2.

It has herein been determined how to target the reduction of thermal contact resistance (TCR) at the metal-plastic interface 20 to enhance the contact pressure. Desirably, the contact pressure is increased sufficiently to counter the difference in coefficient of thermal expansion (CTE) of the insert and the thermally conductive polymer. Not to be limited by theory, during operation, the LED heats up, causing the heat sink to increase in temperature. The polymer has a higher CTE than the metal of the metal insert and hence, during operation, it is believed that the contact pressure will reduce as the temperature increases. Consequently, if the contact pressure between the insert and polymer heat sink are not increased, the pressure can go to zero when the heat sink is in use. Hence, the contact pressure is desirably increased after molding such that even at elevated temperature (e.g., during use of the heat sink) there is a positive contact pressure between the metal insert and the polymer heat sink (e.g., the pressure is greater than zero).

Once the contact pressure is enhanced at the bi-material interface 20, the heat transfer which happens across the interface 20 is enhanced. Thus, by enhancing (increasing) the contact pressure, the overall thermal conductivity of the hybrid LED heat sink assembly 10 is enhanced (increased). Specifically, it has been determined that operation(s) after over-molding, such as shot peening of the metal insert 12, as further described below, can enhance the heat transfer (thermal efficiency) of the over-molded part. Thus, after forming the LED heat sink assembly (e.g., after producing the over-molded part comprising interface 20 between the polymer heat sink 14 and the metal insert 12, as shown in FIG. 2), the contact pressure can be increased, e.g., by shot peening the exposed inner surface 16 of the metal insert 12.

Regarding shot peening, shot peening is a process in which balls (e.g., small, glass and/or metal (e.g., lead) balls) are projected onto the surface of a material at an elevated velocity. Shot peening can be employed to enhance fatigue life of materials because, in compression, cracks will not become initiated and propogated. Here, it has been determined that if the inner surface 16 of the metal insert 12 is shot peened after the polymer heat sink has been overmolded, compressive stresses will be induced on the inner surface 16 of the metal insert 12 as the inner surface 16 is shifted outward due to the force of the projections (e.g., balls) striking the inner surface 16. Thus, the shot peening causes a local polymer deformation of the polymer heat sink 14 as the metal insert 12 is pushed outward at the outer surface 18 of the metal insert 12 which is in contact with the polymer heat sink 14. As the polymer heat sink 14 is already over-molded over the metal insert 12, the polymer will attempt to resist the outer pushing momentum of the shot peening resulting in an increase in contact pressure between the metal insert 12 and polymer heat sink 14 at the interface 20.

It has further been determined that based on the parameters of the metal insert 12 such as size, thickness, material, etc., the shot peening processing parameters can be controlled and tailored to obtain the desired amount of polymer deformation. Controlling the amount of deformation can thus allow the contact pressure to be controlled/tailored which, in turn, allows the control of the overall thermal conductivity of the over-molded part. For example, based upon the parameters of the insert, the size of the shot peening balls can be selected to accurately pin point the locations to shot peen on the metal insert 12 and thus manipulate the momentum/velocity of the balls striking the surface during processing. Also, the metal insert 12 can be sufficiently thin (e.g., less than or equal to 3 millimeters (mm), specifically, less than or equal to 2 mm, and more specifically, 1 to 1.5 mm), such that when the inner surface 16 of the metal insert 12 is shot peened, the outer surface 18 of the metal insert 12 can be effectively protruded toward the adjacent polymer heat sink 14.

As the contact pressure is a function of the surface roughness, it also is possible, to additionally include further processing to decrease the surface roughness of the outer surface 18 of the metal insert (i.e., surface that comes in contact with polymer) before over-molding. The further processing can include grinding or polishing or a combination comprising at least one of the foregoing. Processes such as drilling, extrusion, machining, die casting, and laser cutting can create a greater surface roughness than grinding and polishing. At a bi-material interface with surface roughness the contact happens only at high points (asperities). Hence polishing is recommended to ensure more surface comes into contact.

Typical surface roughness values that can be obtained by polishing and grinding are 0.1 to 0.4 micrometers ($\mu m$) and 0.1 to 0.6 $\mu m$, respectively. In comparison, die casting and machining create a roughness of 0.8 to 1.6 $\mu m$, laser cutting is 0.8 to 6.3 $\mu m$, extrusion is 0.8 to 3.2 $\mu m$, and drilling is 1.6 to 6.3 $\mu m$. Polishing the surface area prior to over-molding would cause protrusions on the outer surface 18 of the metal insert 12 which will be in contact with the thermally conductive polymer to reduce. The contact area would increase and surface roughness would decrease thereby enhancing heat transfer.

Figure 4:
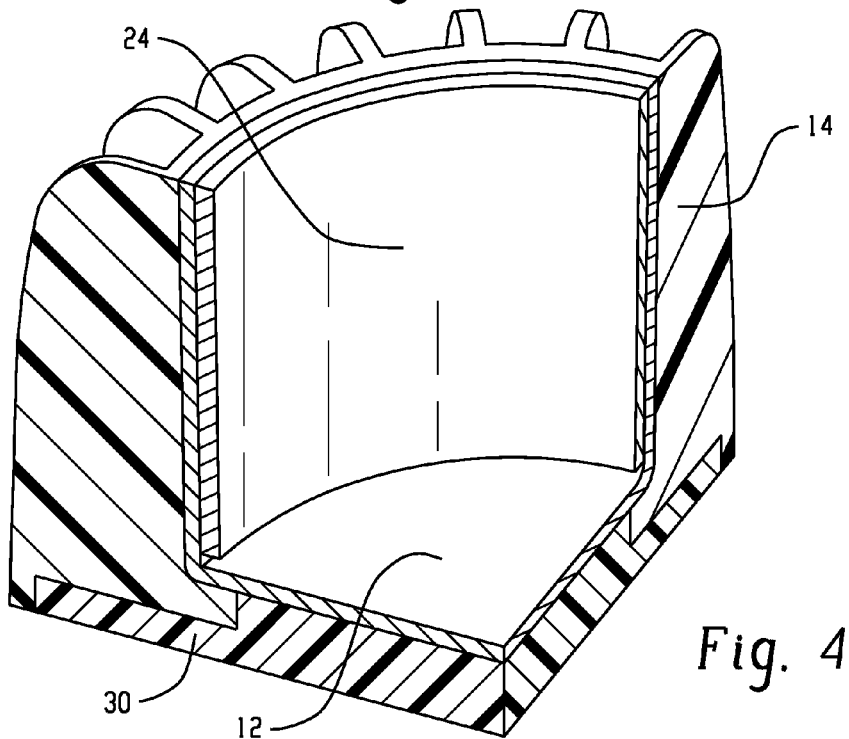
FIG. 4 is a cutaway, partial view of a metal-plastic hybrid heat sink with a pressfit insert.
Figure 5:
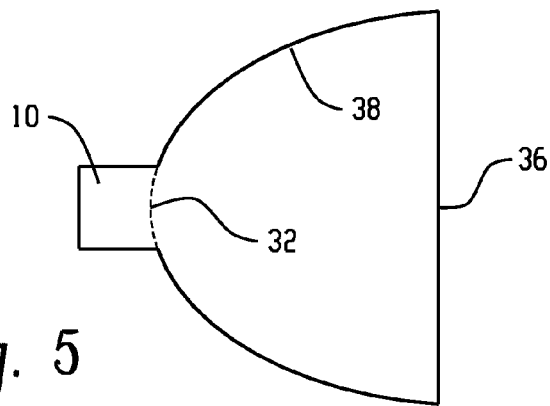
FIG. 5 is an embodiment of a lamp assembly comprising a metal-plastic hybrid heat sink.
Figure 6:
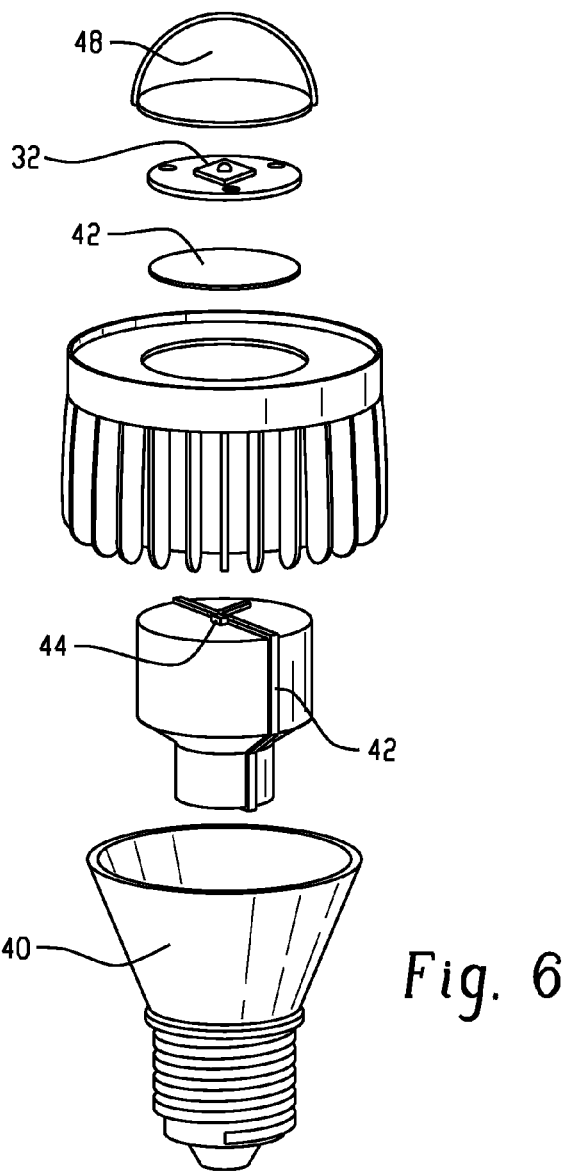
FIG. 6 is an expanded view of another embodiment of a LED lamp assembly comprising the metal-plastic hybrid heat sink.

Alternatively or in addition, pressfit insert can be employed. Referring to FIG. 4, the pressfit insert 24 is located in the heat sink, inside of the metal insert 12. The pressfit insert 24 has an outer diameter that is greater than the inner diameter of the metal insert 12. The pressfit insert 24 exerts radial force on the metal insert 12. The pressfit insert 24 can have a shape that is compatible with the shape of the metal insert 24, exerting pressure thereon. For example, the pressfit insert can be a hollow tube, e.g., an aluminum tube. It can have a wall thickness of 0.8 to 1.5 mm. Radial protrusion between the pressfit insert 24 and the metal insert 12 can be 0.05 to 0.025 mm. In other words, the pressfit insert can have an outer diameter that is 0.025 mm to 0.05 mm greater than the inner diameter of the metal insert. Due to the contact between the metal insert 12 and the polymer heat sink 14 at interface 20, the thermal conductivity of the hybrid LED heat sink assembly is enhanced, as in the case of shot peening, thereby reducing the thermal contact resistance (TCR).

Optionally, the polymer heat sink 14 could be formed by injecting the thermally conductive polymer material into a mold comprising the metal insert and allowing the thermally conductive polymer material to solidify, wherein, until the thermally conductive polymer material is injected into the mold, the metal insert 12 is maintained at a temperature of less than or equal to room temperature (with room temperature being a temperature of 20° C. to 25° C.) prior to injecting the thermally conductive polymer material into the mold. Thus, the temperature of metal insert 12 can be sufficiently controlled prior to injection molding to also enhance (increase) the contact pressure at the metal-plastic interface 20. More particularly, prior to over-molding, the metal insert 12 can be maintained at room temperature, or cooled below room temperature. Thus, the metal insert 12, which is now cooled or maintained at room temperature, can then be inserted into the molding apparatus.

For example, a positive contact pressure between the metal insert 12 and polymer heat sink 14 at the interface 20 can be achieved. Accordingly, as the molten thermally conductive polymer is injected into a mold comprising the metal insert 12 which has a temperature at or below room temperature, the metal insert 12 will thus try to expand while the polymer is shrinking due to solidification, thereby increasing a contact pressure (e.g., as compared to the same materials, but with a metal insert that is also heated). However, due to the molten thermally conductive polymer flowing under pressure during the molding operation, the metal insert 12 will not reach a nominal size and thus remain at an interference fit as the metal material of the metal insert 12 pushes or expands toward to the polymer material.

Figure 3:
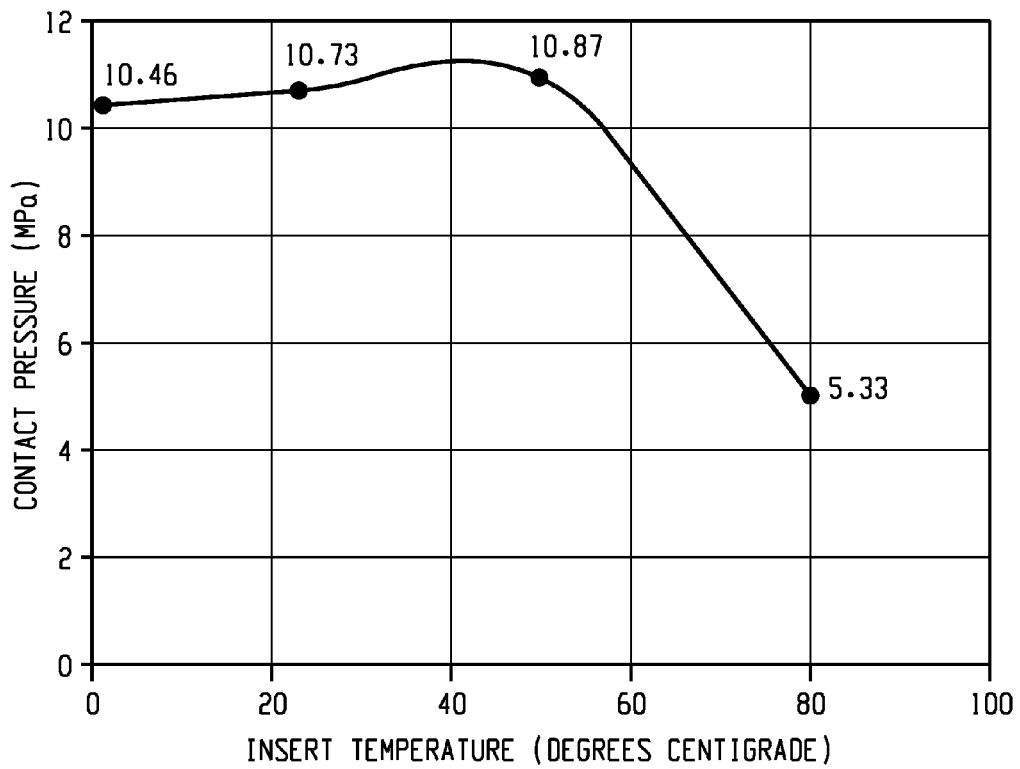
FIG. 3 is a graphical illustration of insert temperature versus contact pressure for the heat sink assembly of FIG. 1.

Referring to FIG. 3, the simulation graph shows that at an insert temperature (e.g., less than or equal to 50° C., for example, 20° C. to 50° C., or 30° C. to 50° C., or 35° C. to 45° C.), the contact pressure can be increased, compared to having heated the insert to greater than or equal to 80° C. For example, introducing the insert to the mold (wherein the mold is at molding temperature) and molding before the insert reaches the molding temperature, can increase the contact pressure. Desirably, the mold is brought to molding temperature, the insert is subsequently introduced into the mold, and the molding is performed promptly after placing the insert into the mold. Optionally, the insert can be introduced to the heated mold when the insert is less than or equal to 30° C., specifically, less than or equal to 25° C., more specifically, less than or equal to 20° C. The contact pressure can be increased without any adverse impact on warpage.

A provision also can be made in the core to lock the metal insert 12 into place and prevent edges of the metal insert 12 from flaring or curling up as the molten thermally conductive polymer material is inserted over the metal insert 12 and fills the mold. Such flaring or curling of metal edges can occur during insert molding processes when a molten polymer is injected over a metal insert.

It is noted that the above-described shot peening techniques also could be employed with the foregoing temperature management processes, e.g., introducing the insert at less than or equal to 30° C. to a heated mold and then promptly molding.

Advantages of the present processes and designs according to embodiments include the ability to increase the thermal conductivity of a hybrid heat sink assembly such that heat can quickly and effectively be dissipated away from a light emitting diode and/or the LED chip. Further advantages include the ability to enable LED devices having improved electrical isolation, design flexibility, part integration, and/or lighter weight devices, as a result of the hybrid metal-plastic configuration, according to embodiments.

Embodiment 1

A method of making a heat sink assembly (10), comprising: forming a heat sink assembly (10) comprising a polymer heat sink (14) around a metal insert (12), the polymer heat sink (14) comprising a thermally conductive polymer material, wherein the heat sink assembly (10) has a contact pressure between the polymer heat sink (14) and the metal insert (12); and increasing the contact pressure.

Embodiment 2

The method of Embodiment 1, wherein the metal insert (12) in the heat sink assembly (10) has an exposed inner surface (16) and has an outer surface (18) in contact with the polymer heat sink (14), wherein increasing the contact pressure comprises shot peening the inner surface (16).

Embodiment 3

The method of any of Embodiments 1-2, wherein the contact pressure is increased by greater than or equal to 10%.

Embodiment 4

The method of any of Embodiments 1-3, wherein the contact pressure is increased by greater than or equal to 25%.

Embodiment 5

The method of any of Embodiments 1-4, wherein increasing the contact pressure comprises increasing the contact pressure to a point such that during use, a use contact pressure between the metal insert (12) and the polymer heat sink (14) is greater than zero.

Embodiment 6

A method of making a heat sink assembly (10), comprising: forming a heat sink assembly (10) comprising a polymer heat sink (14) around a metal insert (12), the polymer heat sink (14) comprising a thermally conductive polymer material, wherein the metal insert (12) has an exposed inner surface (16) and has an outer surface (18) in contact with the polymer heat sink (14); and shot peening the inner surface (16) of the heat sink assembly (10).

Embodiment 7

The method any of Embodiments 1-6, wherein the metal insert has a surface roughness, and further comprising reducing the surface roughness prior to forming the heat sink assembly (10).

Embodiment 8

A method of making a heat sink assembly (10), comprising: reducing a surface roughness of a metal insert (12); and subsequent to reducing the surface roughness, forming a heat sink assembly (10) comprising a polymer heat sink (14) around the metal insert (12), the polymer heat sink (14) comprising a thermally conductive polymer material, wherein the metal insert (12) has an exposed inner surface (16) and has an outer surface (18) in contact with the polymer heat sink (14).

Embodiment 9

The method of any of Embodiments 7-8, wherein reducing the surface roughness comprises at least one of grinding or polishing the metal insert.

Embodiment 10

The method of any of Embodiments 1-9, wherein forming the heat sink assembly (10) comprises: heating a mold to a mold temperature; subsequent to the mold attaining the mold temperature, introducing the metal insert to the mold, wherein the metal insert has an insert temperature of 30° C. to 70° C. when it is inserted into the mold; and over-molding the metal insert with the thermally conductive polymer material.

Embodiment 11

The method of Embodiment 10, further comprising, after introducing the metal insert to the mold, closing the mold, and wherein the over-molding is performed in less than or equal to 10 seconds of the closing of the mold. In other words, from the time the mold is closed, the thermally conductive polymer is introduced to the mold in less than or equal to 10 seconds.

Embodiment 12

A method of making a heat sink assembly (10), comprising: heating a mold to a mold temperature; subsequent to the mold attaining the mold temperature, introducing a metal insert to the mold, wherein the metal insert has an insert temperature of 30° C. to 70° C. when it is inserted into the mold; closing the mold; and in less than or equal to 10 seconds of closing the mold, over-molding the metal insert with a thermally conductive polymer material to form a heat sink assembly (10). The heat sink assembly (10) has a contact pressure between the polymer heat sink (14) and the metal insert (12).

Embodiment 13

The method of any of Embodiments 11-12, wherein the over-molding is performed in less than or equal to 5 seconds of the closing of the mold.

Embodiment 14

The method of any of Embodiments 10-13, wherein the insert temperature is 35° C. to 65° C.

Embodiment 15

The method of any of Embodiments 10-14, wherein the insert temperature is 40° C. to 60° C.

Embodiment 16

The method of any of Embodiments 10-15, wherein the insert temperature is 45° C. to 55° C.

Embodiment 17

A heat sink assembly (10) made by the method of any of Embodiments 1-16.

Embodiment 18

An illuminant, comprising: a light emitting diode; the heat sink assembly (10) of Embodiment 17; and a housing comprising a reflector, wherein the light emitting diode is located in the housing in optical communication with the reflector.

In general, the embodiments may alternately comprise, consist of, or consist essentially of, any appropriate components herein disclosed. The embodiments may additionally, or alternatively, be formulated so as to be devoid, or substantially free, of any components, materials, ingredients, adjuvants or species used in the prior art compositions or that are otherwise not necessary to the achievement of the function and/or objectives of the embodiments.

Intrinsic thermal conductivity of a component, as used herein, is based on indicative values described in the literature, such as in "Thermal conductivity of Nonmetallic Solids," Y. S. Touloukian, R. W. Powell, C. Y. Ho, and P. G. Klemans, IFI/Plenum: New York-Washington, 1970 or "Thermal Conductivity—Theory, Properties and Applications," T. M. Tritt, Ed., Kluwer Academic/Plenum Publishers: New York, 2004. Thermal conductivity of a composition, as used herein, is tested according to ASTM E1461 in the through-plane (sample thickness) direction. It is the thermal conductivity of the material independent of how much of the material is present and independent of the form (shape, size, etc.) of the material.

Volume resistivity, as used herein, is measured by notching a sample bar on both ends followed by a cold-fracture at −60° C. The fractured surfaces are treated with silver paint and dried. The resistance through the bar is measured with a multi-meter to yield the volume resistivity (in $\Omega \cdot m$) and calculated from: volume resistivity=$(R*A/L)$, where R is the electrical resistance (in $\Omega$), A is the sample surface area, and L is the sample length (the electrical distance).

All ranges disclosed herein are inclusive of the endpoints, and the endpoints are independently combinable with each other (e.g., ranges of "up to 25 wt. %, or, more specifically, 5 wt. % to 20 wt. %", is inclusive of the endpoints and all intermediate values of the ranges of "5 wt. % to 25 wt. %," etc.). "Combination" is inclusive of blends, mixtures, alloys, reaction products, and the like. Furthermore, the terms "first," "second," and the like, herein do not denote any order, quantity, or importance, but rather are used to differentiate one element from another. The terms "a" and "an" and "the" herein do not denote a limitation of quantity, and are to be construed to cover both the singular and the plural, unless otherwise indicated herein or clearly contradicted by context. The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

We claim:

1. A method of making a heat sink assembly, comprising:
forming a heat sink assembly comprising a polymer heat sink around a metal insert, the polymer heat sink comprising a thermally conductive polymer material, wherein the heat sink assembly has a contact pressure between the polymer heat sink and the metal insert; and
increasing the contact pressure.

2. The method of claim 1, wherein the metal insert in the heat sink assembly has an exposed inner surface and has an outer surface in contact with the polymer heat sink, wherein increasing the contact pressure comprises shot peening the inner surface.

3. The method of claim 1, wherein forming the heat sink assembly comprises
heating a mold to a mold temperature;
subsequent to the mold attaining the mold temperature, introducing the metal insert to the mold, wherein the metal insert has an insert temperature of 30° C. to 70° C. when it is inserted into the mold; and
over-molding the metal insert with the thermally conductive polymer material.

4. The method of claim 3, further comprising, after introducing the metal insert to the mold, closing the mold, and wherein the over-molding is performed in less than or equal to 10 seconds of the closing of the mold.

5. The method of claim 4, wherein the over-molding is performed in less than or equal to 5 seconds of the closing of the mold.

6. The method of claim 3, wherein the insert temperature is 35° C. to 65° C.

7. The method of claim 6, wherein the insert temperature is 40° C. to 60° C.

8. The method of claim 7, wherein the insert temperature is 45° C. to 55° C.

9. The method of claim 3, wherein the metal insert has an exposed inner surface and has an outer surface in contact with the polymer heat sink, wherein increasing the contact pressure comprises shot peening the inner surface.

10. The method of claim 1, wherein the contact pressure is increased by greater than or equal to 10%.

11. The method of claim 1, wherein the contact pressure is increased by greater than or equal to 25%.

12. The method of claim 1, wherein increasing the contact pressure comprises increasing the contact pressure to a point such that during use, a use contact pressure between the metal insert and the polymer heat sink is greater than zero.

13. The method of claim 1, wherein the metal insert has a surface roughness, and further comprising reducing the surface roughness prior to forming the heat sink assembly.

14. The method of claim 13, further comprising at least one of grinding or polishing the metal insert prior to forming the heat sink assembly.

15. A heat sink assembly made by the method of claim 1.

16. A method of making a heat sink assembly, comprising:
forming a heat sink assembly comprising a polymer heat sink around a metal insert, the polymer heat sink comprising a thermally conductive polymer material, wherein the metal insert has an exposed inner surface and has an outer surface in contact with the polymer heat sink; and
shot peening the inner surface of the heat sink assembly.

17. The method of claim 16, wherein forming the heat sink assembly comprises:
heating a mold to a mold temperature;
subsequent to the mold attaining the mold temperature, introducing the metal insert to the mold, wherein the metal insert has an insert temperature of 30° C. to 70° C. when it is inserted into the mold; and
over-molding the metal insert with the thermally conductive polymer material.

18. The method of claim 17, further comprising, after introducing the metal insert to the mold, closing the mold, and wherein the over-molding is performed in less than or equal to 5 seconds of the closing of the mold.

19. A method of making a heat sink assembly, comprising:
reducing a surface roughness of a metal insert; and
subsequent to reducing the surface roughness, forming a heat sink assembly comprising a polymer heat sink around the metal insert, the polymer heat sink comprising a thermally conductive polymer material, wherein the metal insert has an exposed inner surface and has an outer surface in contact with the polymer heat sink.

20. A method of making a heat sink assembly, comprising:
heating a mold to a mold temperature;
subsequent to the mold attaining the mold temperature, introducing a metal insert to the mold, wherein the metal insert has an insert temperature of 30° C. to 70° C. when it is inserted into the mold;
closing the mold; and
in less than or equal to 10 seconds of closing the mold, over-molding the metal insert with a thermally conductive polymer material to form a heat sink assembly.

21. An illuminant, comprising:
a light emitting diode;
a heat sink assembly thermally connected to the light emitting diode, wherein the heat sink assembly comprises a metal insert in physical contact with a polymer heat sink at an interface, wherein after the heat sink assembly was formed, a contact pressure between the metal insert and the polymer heat sink was increased; and
a housing comprising a reflector, wherein the light emitting diode is located in the housing in optical communication with the reflector.

* * * * *